United States Patent
Alves et al.

(10) Patent No.: US 11,586,918 B2
(45) Date of Patent: Feb. 21, 2023

(54) METHODS AND SYSTEMS FOR AUTOMATICALLY DETECTING DESIGN ELEMENTS IN A TWO-DIMENSIONAL DESIGN DOCUMENT

(71) Applicant: Bluebeam, Inc., Pasadena, CA (US)

(72) Inventors: Bruno Alves, San diego, CA (US); Jae Min Lee, Fullerton, CA (US)

(73) Assignee: Bluebeam, Inc., Pasadena, CA (US)

( * ) Notice: Subject to any disclaimer, the term of this patent is extended or adjusted under 35 U.S.C. 154(b) by 201 days.

(21) Appl. No.: 16/893,462

(22) Filed: Jun. 5, 2020

(65) Prior Publication Data
US 2020/0387788 A1    Dec. 10, 2020

Related U.S. Application Data

(60) Provisional application No. 62/858,095, filed on Jun. 6, 2019.

(51) Int. Cl.
*G06N 3/08* (2006.01)
*G06F 16/93* (2019.01)
*G06N 3/04* (2006.01)

(52) U.S. Cl.
CPC .............. *G06N 3/08* (2013.01); *G06F 16/93* (2019.01); *G06N 3/04* (2013.01)

(58) Field of Classification Search
CPC . G06N 3/08; G06N 3/04; G06N 5/025; G06F 16/93; G06F 16/583; G06F 40/284; G06F 8/30; G06F 40/55; G06F 40/30; G06K 9/6232

USPC ................... 706/20; 707/803, 802, 755, 758
See application file for complete search history.

(56) References Cited

U.S. PATENT DOCUMENTS

| | | |
|---|---|---|
| 2003/0071810 A1 | 4/2003 | Shoov et al. |
| 2013/0249906 A1* | 9/2013 | Gunderson ............. G06T 15/20 |
| | | 345/420 |
| 2016/0019419 A1 | 1/2016 | Chen |
| 2018/0158210 A1 | 6/2018 | Estrada et al. |
| 2019/0130573 A1 | 5/2019 | Xu et al. |
| 2020/0175095 A1* | 6/2020 | Morariu ............... G06N 3/0472 |
| 2020/0265121 A1* | 8/2020 | Myers ................... G06T 11/203 |
| 2020/0279364 A1* | 9/2020 | Sarkisian .............. G06F 16/252 |

* cited by examiner

*Primary Examiner* — Evan Aspinwall
(74) *Attorney, Agent, or Firm* — Bookoff McAndrews, PLLC

(57) ABSTRACT

Systems and methods are disclosed for automatically detecting a design element in a design document. One method comprises receiving a design document and generating an enhanced design document based on the received design document. The enhanced design document may be generated by augmenting additional information to the design document using machine learning techniques. In response to receiving a user input, one or more design elements in the enhanced design document may be determined, and additional information associated with the determined one or more design elements may be displayed to the user.

20 Claims, 14 Drawing Sheets

METHODS AND SYSTEMS FOR AUTOMATICALLY DETECTING DESIGN ELEMENTS IN A TWO-DIMENSIONAL DESIGN DOCUMENT

CROSS-REFERENCE TO RELATED APPLICATION(S)

This patent application claims the benefit of priority to U.S. Provisional Application No. 62/858,095, filed on Jun. 6, 2019, the entirety of which is incorporated herein by reference.

TECHNICAL FIELD

The present disclosure relates to systems and methods for object detection in an electronic document. More particularly, the present disclosure relates to systems and methods for generating an enhanced design document comprising design elements detected using machine learning techniques. The present disclosure further relates to systems and methods for identifying a design element in an enhanced design document based on a search query.

BACKGROUND

Creation, distribution, and management of information is at the core of modern day business. Different ways of presenting information have been developed, including word processing documents, spreadsheets, graphics, photographs, design drawings and plans, and so forth. This information content may be generated using a specific software application, and are generally referred to as electronic documents. An electronic document may contain texts or graphics, or both.

One of the significant advantages of working with electronic documents is the ability to search a large volume of information in a short period of time. With non-electronic or paper documents, searching for an item of information, even with the best of cataloging and other indexing tools, proved to be an arduous and painstaking process. In general, searching within electronic documents has been largely limited to text-based methods, where the user enters a simple word query and the locations where that queried word or words are found are identified via optical character characterization (OCR) or text-matching techniques, for example. Boolean and natural language searching techniques are also known, though typically utilized for searching across databases of documents, web pages on the World Wide Web, and so forth. Ultimately, however, these are text-based queries involving identification of a target word or target words in the electronic documents.

The background description provided herein is for the purpose of generally presenting the context of the disclosure. Unless otherwise indicated herein, the materials described in this section are not prior art to the claims in this application and are not admitted to be prior art, or suggestions of the prior art, by inclusion in this section.

SUMMARY OF THE DISCLOSURE

One embodiment provides a computer-implemented method for automatically detecting a design element in a design document, comprising: receiving a design document; and generating an enhanced design document based on the received design by: detecting, using a trained machine learning model, one or more design elements in the design document; determining a location associated with each of the detected one or more design elements; determining a type associated with each of the detected one or more design elements; and augmenting the design document with the determined location and type of each of the detected one or more design elements.

One embodiment provides a system for automatically detecting a design element in a design document. The system may comprise one or more processors; and a non-transitory computer readable medium storing instructions which, when executed by the one or more processors, cause the one or more processors to perform a method comprising: receiving a design document; and generating an enhanced design document based on the received design document by: detecting, using a trained machine learning model, one or more design elements in the design document; determining a location associated with each of the detected one or more design elements; determining a type associated with each of the detected one or more design elements; and augmenting the design document with the determined location and type of each of the detected one or more design elements.

One embodiment provides a non-transitory computer readable medium for automatically detecting a design element in a design document. The non-transitory computer readable medium may store instructions that, when executed by one or more processors, cause the one or more processors to perform a method comprising: receiving a design document; and generating an enhanced design document based on the received design document by: detecting, using a trained machine learning model, one or more design elements in the design document; determining a location associated with each of the detected one or more design elements; determining a type associated with each of the detected one or more design elements; and augmenting the design document with the determined location and type of each of the detected one or more design elements.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
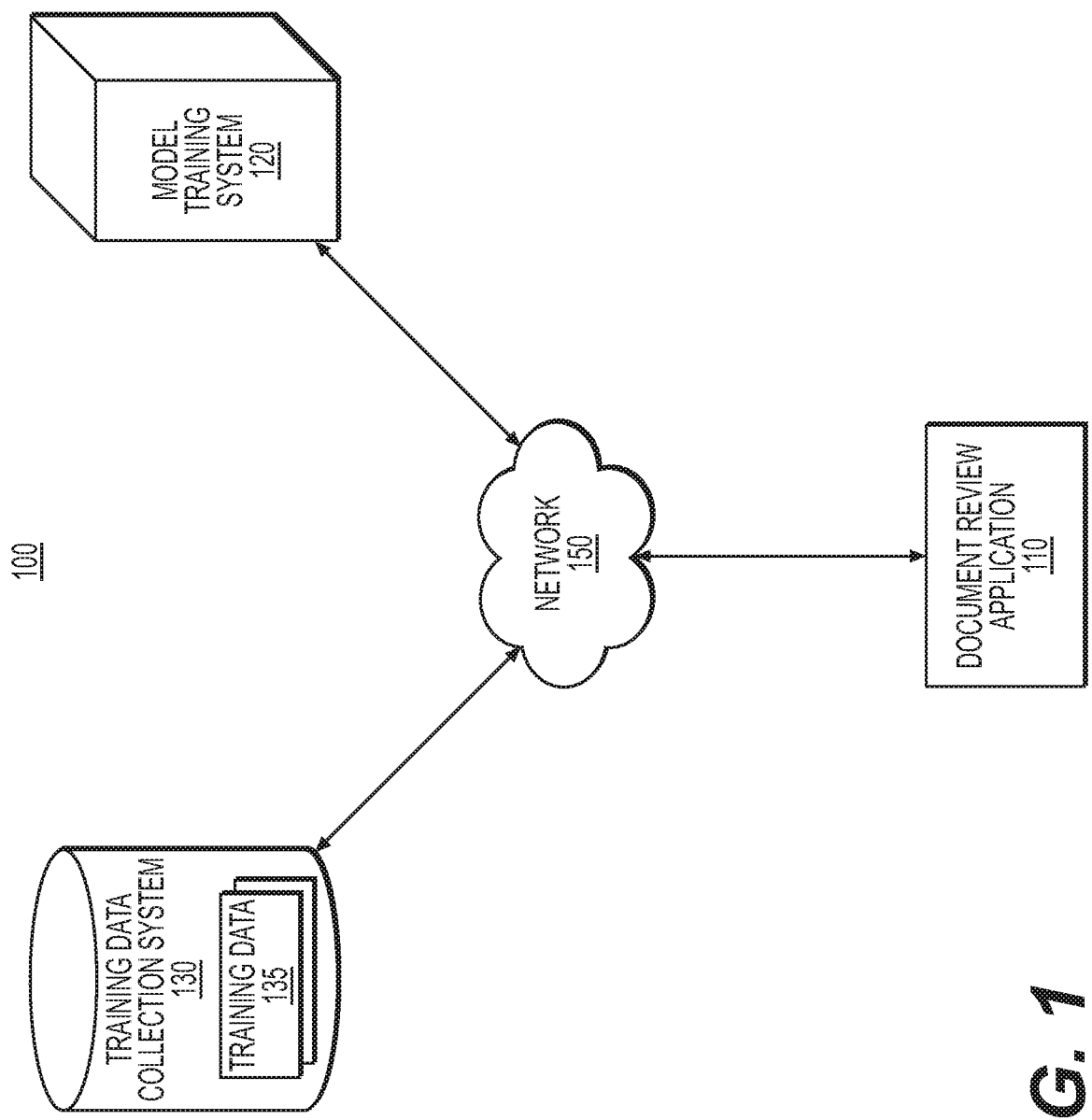
FIG. 1 shows an exemplary system infrastructure of a design element detection system, according to one aspect of the present disclosure.

The following embodiments describe methods and systems for object detection in an electronic document and, more particularly, for generating an enhanced design document comprising design elements detected using machine learning techniques.

Due to the existence of different computing platforms employing a variety of operating systems, application programs, and processing and graphic display capabilities, device-independent file formats, such as the Portable Document Format (PDF), have been developed to facilitate information exchange among different computing platforms. The PDF standard is a combination of a number of technologies, including a simplified PostScript interpreter subsystem, a font embedding subsystem, and a storage subsystem. PostScript is a page description language for generating the layout and the graphics of a document. Further, per the requirements of the PDF storage subsystem, all elements of the document, including text, vector graphics, and raster (bitmap) graphics (collectively referred to herein as graphic elements or more particularly, design elements in the case of design documents) are encapsulated in a single file. The graphical elements are not necessarily encoded to a specific operating system, software application, or hardware, but may be designed to be rendered in the same manner regardless of the specifications of the system writing or reading such data. The cross-platform capability of PDF aided its widespread adoption, and it is now a de facto document exchange standard. Although originally proprietary, PDF has been released as an open standard published by the International Organization for Standardization (ISO) as ISO/IEC 32000-2:2017. Currently, PDF is utilized to encode a wide variety of document types, including those composed largely of text, and those composed largely of vector and raster graphics. Due to its versatility and universality, files in the PDF format are often preferred over more particularized file formats of specific applications. As such, documents are frequently converted to the PDF format.

The information/subject matter stored in and exchanged as PDF files is becoming more complex, and a wide range of documents are being digitized as part of the trend toward paperless offices. Indeed, engineering diagrams, construction plans, wiring diagrams, and so forth are oftentimes saved in, and shared via, PDF documents. With the increasing use of graphics in documents, particularly in those types listed above, querying for graphic elements in documents has become a desirable feature.

With non-electronic or paper documents, searching for an item of information, even with the best of cataloging and other indexing tools, proved to be an arduous and painstaking process. With electronic documents such as PDF documents, searching has been largely limited to text-based methods, where the user enters a simple word query and the locations where that queried word or words are found are identified via optical character characterization (OCR) or text-matching techniques, for example. However, these are text-based queries involving identification of a target word or target words in the electronic documents. In other words, such text-based approaches cannot identify and/or classify graphic elements within electronic documents based on their visual characteristics. The ability to identify and/or classify graphic elements based on their visual characteristics becomes even more important and useful when reviewing documents that primarily contain drawings.

Therefore, there is a need for an improved method of automatically detecting design elements in a two-dimensional (2D) design document. Further, there is a need for a mechanism that enables a user reviewing a 2D design document to quickly identify desired design elements within the 2D design document.

The disclosed embodiments may facilitate a more convenient design review process by enabling searching of design elements based on visual characteristics using machine learning. The disclosed embodiments are directed to determining locations and other information associated with design elements in a design document, by using one or more of machine learning techniques and model-to-document linkage techniques. Briefly, in one embodiment, a design document may be received and an enhanced design document may be generated based on the received design document. For instance, one or more design elements in the design document may be detected using a trained machine learning model, and the locations and/or types of the detected design documents may be determined. The design document may be augmented with the determined location and type information to generate the enhanced design document. The enhanced design document may be used to process a search query for a particular type of design elements within the design document. Additional functionalities may also be implemented using the enhanced design document, as will be described in detail below.

The subject matter of the present disclosure will now be described more fully hereinafter with reference to the accompanying drawings, which form a part hereof, and which show, by way of illustration, specific exemplary embodiments. An embodiment or implementation described herein as "exemplary" is not to be construed as preferred or advantageous, for example, over other embodiments or implementations; rather, it is intended to reflect or indicate that the embodiment(s) is/are "example" embodiment(s). Subject matter may be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof. The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of exemplary embodiments in whole or in part.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section.

Referring now to the appended drawings, FIG. 1 shows an exemplary system infrastructure of a design element detection system 100 comprising a user application, a training system, and a data collection system that are communicatively coupled. In general, the design element detection system 100 comprises a document review application 110, a model training system 120, and a training data collection system 130, all connected via a network 150. The network 150 may include the Internet, but may also include other networks such as a corporate WAN, cellular network, satellite network, or combination thereof, for example. The network 150 may be employed to enable data communications between the various entities illustrated in FIG. 1.

Figure 2:
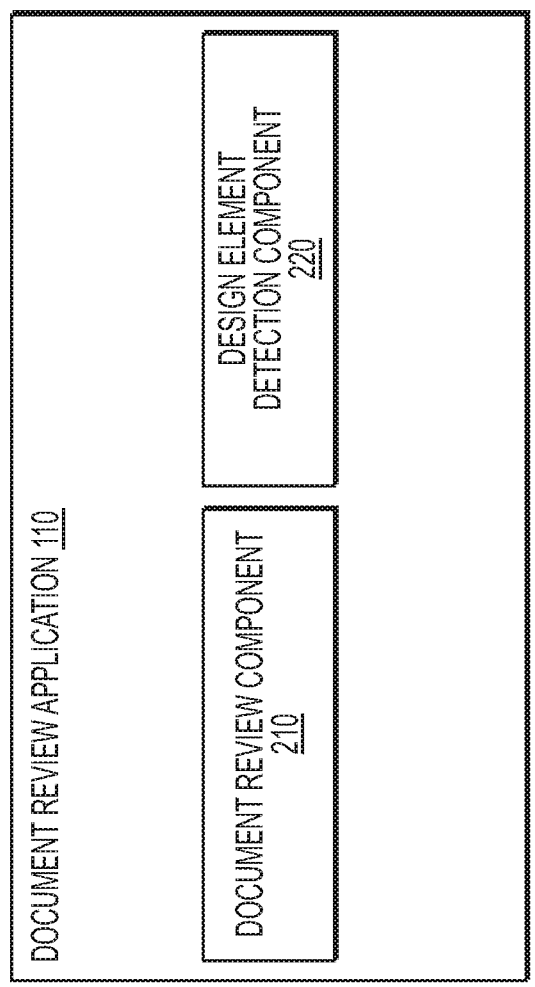
FIG. 2 shows a block diagram of an exemplary document review application, according to one aspect of the present disclosure.
Figure 13:
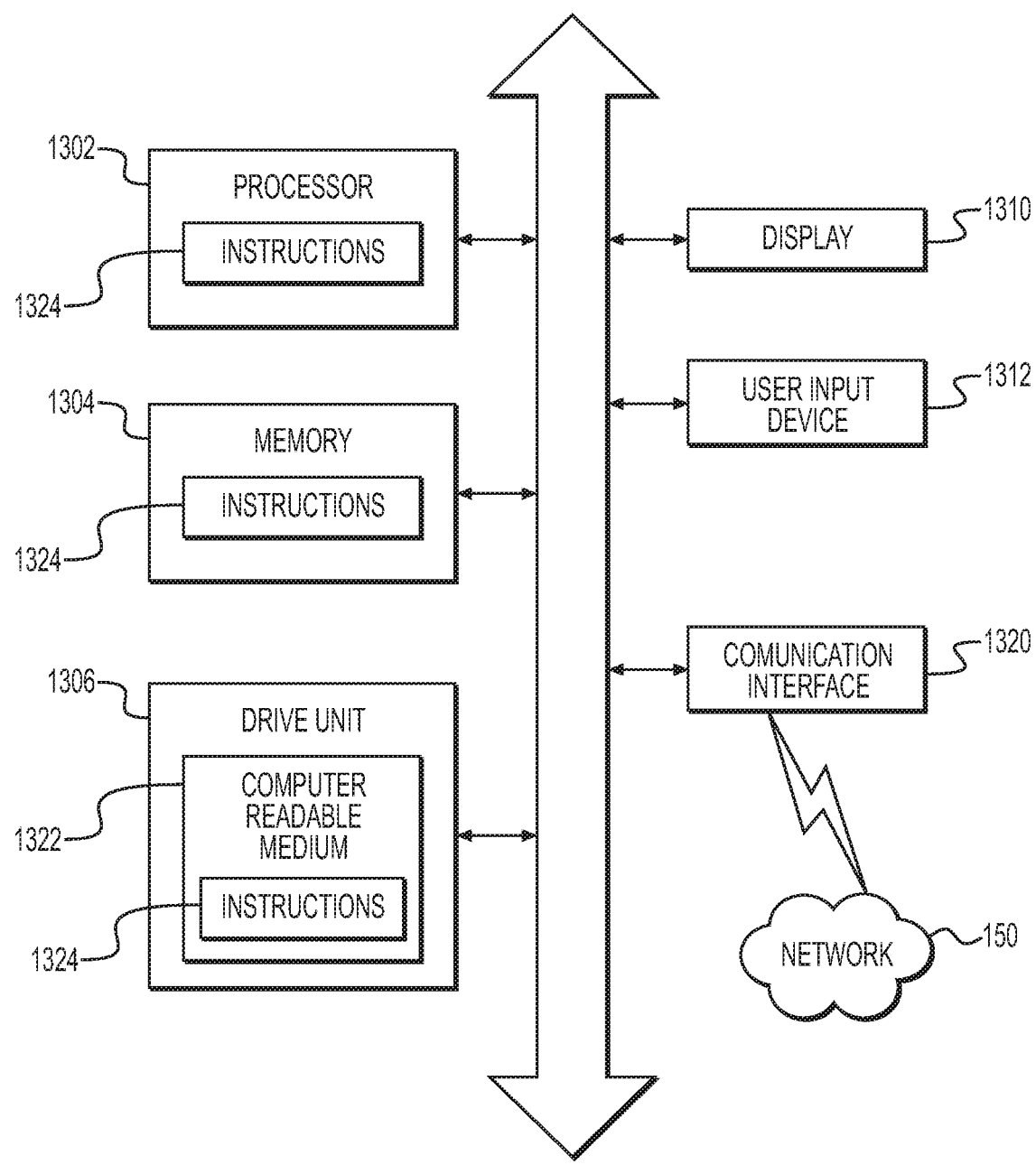
FIG. 13 illustrates an implementation of a computer system that may execute techniques presented herein.

The document review application 110 may be installed on a computing device consistent with or similar to that depicted in FIG. 13. FIG. 2 shows a block diagram of an exemplary document review application, according to one aspect of the present disclosure. In general, the document review application 110 may comprise a document review component 210 and a design element detection component 220, as shown in FIG. 2.

The document review component 210 may enable a user to locate a 2D or three-dimensional (3D) design document from a local or remote storage, open and make modifications to the design document (e.g., add, remove, or modify drawings, annotations, markups, etc.), save the modified design document in a local or remote storage, delete the design document, collaborate with other users synchronously or asynchronously to review/edit the design document, etc. In one embodiment, the document review component 210 may be a PDF document reviewing/editing software component. However, in other embodiments, the document review component 210 may be a document reviewing/editing software component also compatible with other types of files such as, e.g., building information model (BIM) files, word processing documents, computer-aided design (CAD) drawings, etc. The documents reviewed using the document review component 210 may include, but may not be limited to, architectural drawings, engineering drawings, and construction drawings (i.e., documents frequently used in the AEC industry).

The design element detection component 220 may analyze a 2D design document to detect one or more design elements (e.g., walls, column, stairways, doors, windows, etc.) in the 2D design document, and may generate an enhanced 2D design document based on the detected design elements. In general, the 2D design document may be an electronic document that includes a 2D image of a design project. The 2D design document may also comprise supplemental information, such as annotations added by a user. The 2D design document may be, for example, a PDF document, which may be reviewed and edited via the document review component 210. The enhanced 2D design document may be an enhanced version of the 2D design document. For instance, the enhanced 2D design document may comprise an electronic document that includes a 2D image of a design project, augmented with information pertaining to one or more design elements detected within the 2D image. As will be described in greater detail below, the design elements may be detected using machine learning techniques. The information pertaining to each detected design element may include a location of the design element within the 2D image, a type or designation of the design element, and other properties associated with the design element that are found as results of the detection. In general, the information contained in the enhanced 2D design document may be more comprehensive and extensive compared to the information contained in the 2D design document. However, in some cases, the information contained in the enhanced 2D design document may not be more comprehensive or extensive compared to the information contained in the 2D design document.

Using the enhanced 2D design document generated by the design element detection component 220, the document review component 210 may enable the user to search for one or more design elements in the enhanced 2D design document. The document review component 210 may also perform additional functionalities using the enhanced 2D design document. In addition to the search function, the document review component 210 may automatically count the number of design elements found for each type as a result of the search, and may provide the total count via the user interface. Furthermore, based on the information contained in the enhanced 2D design document (e.g., locations, types/designations, etc. of detected design elements), the document review component 210 may perform Americans with Disabilities Act (ADA) validation. In general, the ADA requires that all new or existing construction of places of public accommodation, as well as of commercial facilities such as office building, be accessible to people with disabilities. Using the enhanced 2D design document, the document review component 210 may analyze the design elements and associated properties against ADA requirements and generate validation results based on the analysis.

With renewed reference to FIG. 1, the model training system 120 may comprise one or more computer servers consistent with or similar to that depicted in FIG. 13. The model training system 120 may comprise a single server, or a plurality of servers distributed across the network 150. Notably, the model training system 120 may receive training data 135 from the training data collection system 130 and may train a machine learning model using the training data. The model training system 120 may provide the trained machine learning model to the document review application 110, in order for the design element detection component 220 of the document review application 110 to detect one or more design elements within a 2D design document.

The training data collection system 130 may comprise one or more computer servers consistent with or similar to that depicted in FIG. 13. The training data collection system 130 may comprise a single server, or a plurality of servers distributed across the network 150. Notably, the training data collection system 130 may collect and store training data 135, which may be requested by and transferred to the model training system 120. The training data 135 may comprise sample design elements (i.e., images of sample design elements) and types/designations of the sample design elements. For example, the training data 135 may comprise various construction symbols used in construction or architectural drawings, and their associated types or designations such as a wall, a column, a stairway, a door, a window, etc. Each set of training data 130 may thus include a sample design element and a type/designation associated with the sample design element, for the purpose of training a machine learning model to identify and/or classify design elements within 2D design documents.

Figure 12:
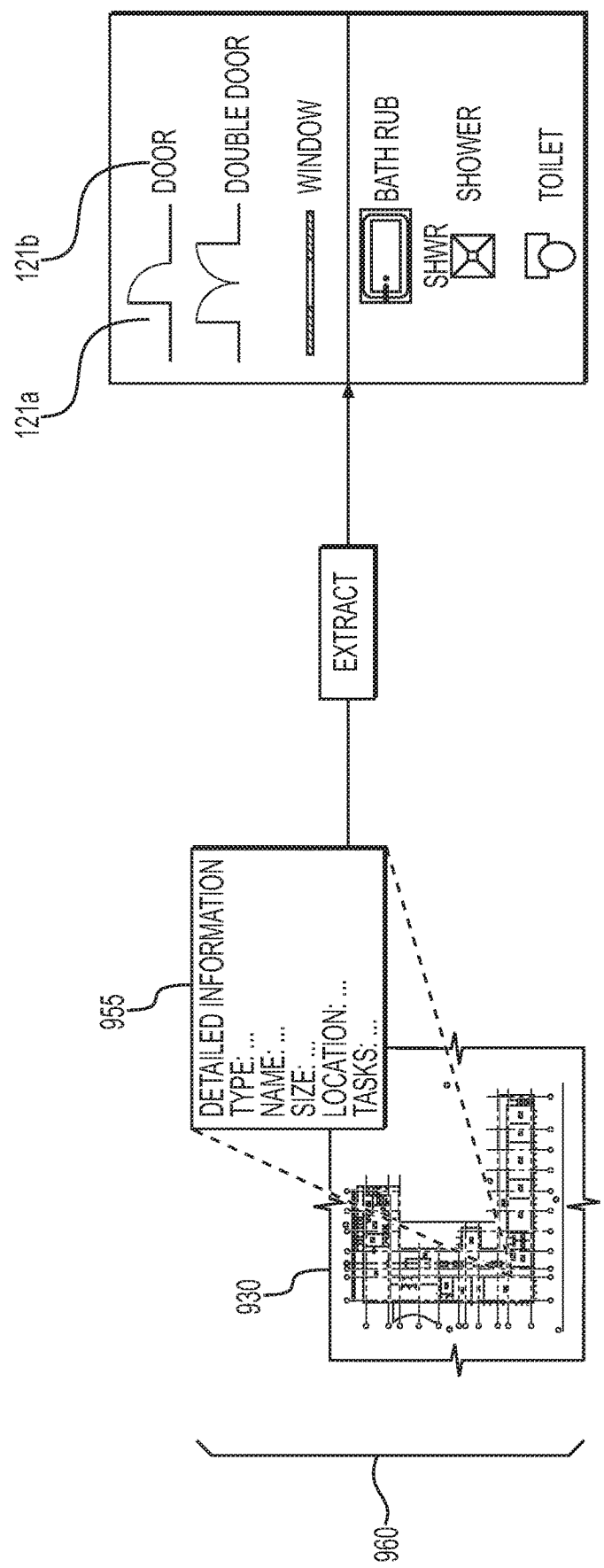
FIG. 12 illustrates an exemplary method of extracting images and types/designations of sample design elements from an enhanced sample design document, according to one aspect of the present disclosure.

The training data 135 may be manually gathered and/or processed by a user using a computing device consistent with or similar to that depicted in FIG. 12, and may be transferred or stored to the training data collection system 130. Also, the training data 135 may be automatically extracted from an enhanced sample design document using a computing device consistent with or similar to that depicted in FIG. 13, as will be described in further detail below, and may be transferred or stored to the training data collection system 130. In other embodiments, the training data 135 may be manually assembled by a user using the training data collection system 130, and/or may be automatically extracted from an enhanced sample design document by the training data collection system 130.

Figure 3:
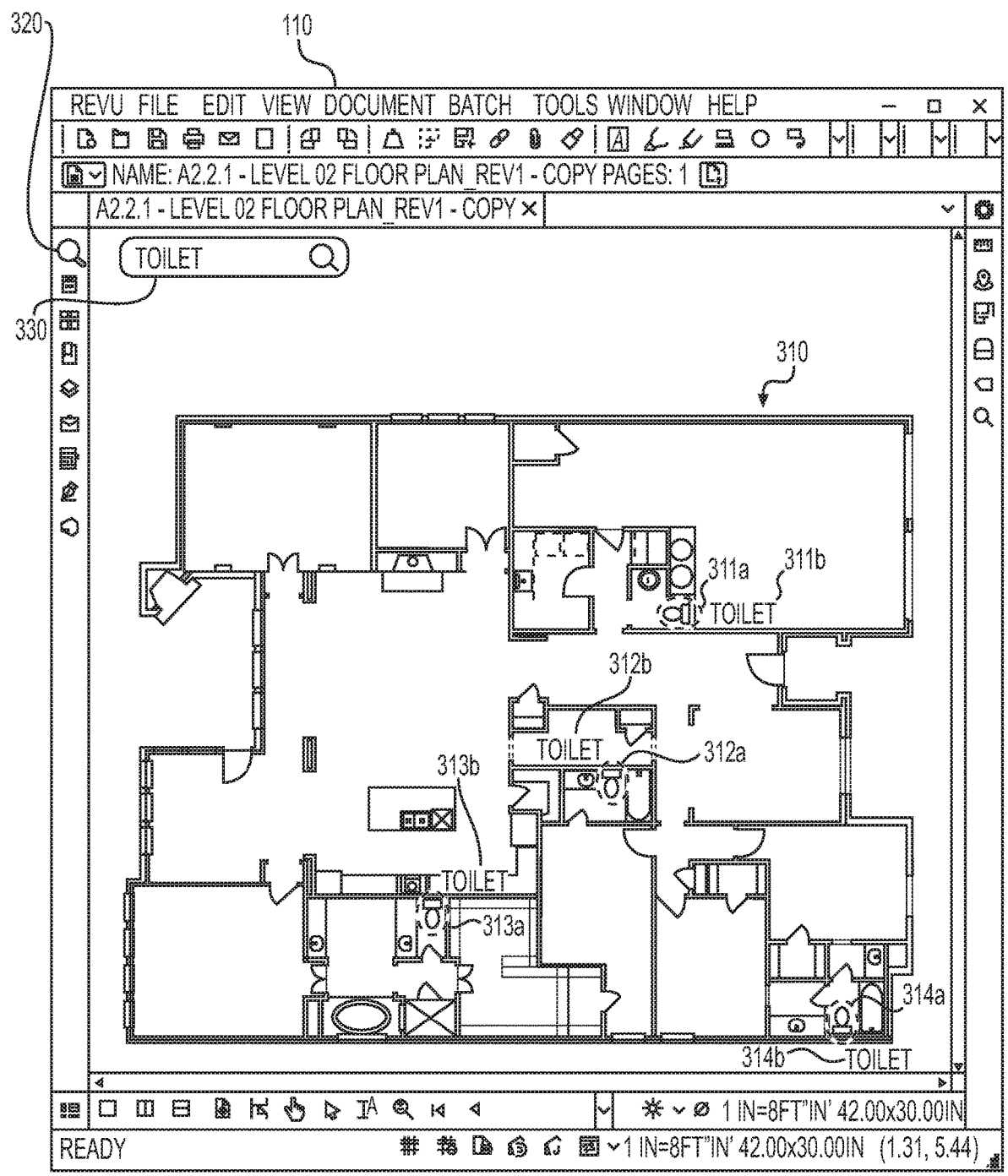
FIG. 3 depicts an exemplary graphical user interface (GUI) of a document review application with a design element detection feature enabled, according to one aspect of the present disclosure.

FIG. 3 depicts an exemplary graphical user interface (GUI) of a document review application 110 with a design element detection feature enabled, according to one aspect of the present disclosure. As alluded to above, the document review application 110 enables a user of a computing device to view, create, manipulate, print, and/or manage 2D design documents. Typically, the document review application 110 may display a 2D design image of the 2D design document 310, along with a limited set of supplemental information associated with the 2D design document 310. For example, the document review application 110 may display annotations and/or symbols added by the user in relation to a particular design element or a region within the displayed 2D design document 310. However, with the implementation of the design element detection feature of the present disclosure, the document review application 110 may also be capable of additional functionalities, such as searching for a particular type of design elements within the 2D design document 310.

For example, as illustrated in FIG. 3, the document review application 110 may enable the user to search for certain design elements within the 2D design document 310. More specifically, the user may enable the search feature by clicking or selecting the search tool icon 320. Upon the user selecting the search tool icon 320, the document review application 110 may display a search box 330 in which the user may input a search query. A search query may comprise one or more keywords specifying one or more types of design elements. In some embodiments, a search query may comprise a keyword requesting identification of all design elements in the 2D design document 310 (e.g., "ALL"). In another embodiment, a search query may not be text or keyword-based, and may comprise an image data such as a thumbnail picture of a design element. In yet another embodiment, a search query may be provided based on a user selecting a design element in the 2D design document 310. The selection may be made by clicking on the design element or drawing a region around the design element using a pointing device or touchscreen. In response to any of these search queries, the document review application 110 may search for matching design elements in the 2D design document 310 and provide the search results via the user interface.

For example, in FIG. 3, the user has entered the search query "TOILET." Upon entering the characters constituting the one or more keywords, the user may hit the "enter" button on the user input device, or may click/select the magnifying glass icon in the search tool box 330 to initiate the search operation. The document review application 110 may then determine one or more design elements that correspond to the search query, and may highlight the determined one or more design elements within the displayed 2D design document 310. For example, upon the user entering the query "TOILET," the document review application 110 identifies the design elements associated with the type/designation "TOILET," and displays a dotted circle, e.g., 311a, 312a, 313a, 314a, around each identified design element. However, the identified design element may be highlighted using a different mark or indicator (i.e., by using any suitable mark or indicator). For example, the identified design elements may be highlighted by color-coding, enclosing the design elements in any suitable geometrical shape, bolding the lines constituting the design elements, etc. In some embodiments, the document review application 110 may also display the corresponding type/designation proximate the identified design elements. For example, the type/designation "TOILET," e.g., 311b, 312b, 313b, 314b, is displayed near each identified design element in FIG. 3. In some embodiments, the document review application 110 may be configured to hold a collaborative session where multiple users may collaboratively view, manipulate, and/or comment on the 2D design document 310 synchronously or asynchronously. During such a collaborative session, the document review application 110 may display/broadcast a user's search for one or more types of design elements and the search results, as described above, to other participants of the collaborative session who may also be using their respective copies of the document review application 110.

Figure 4:
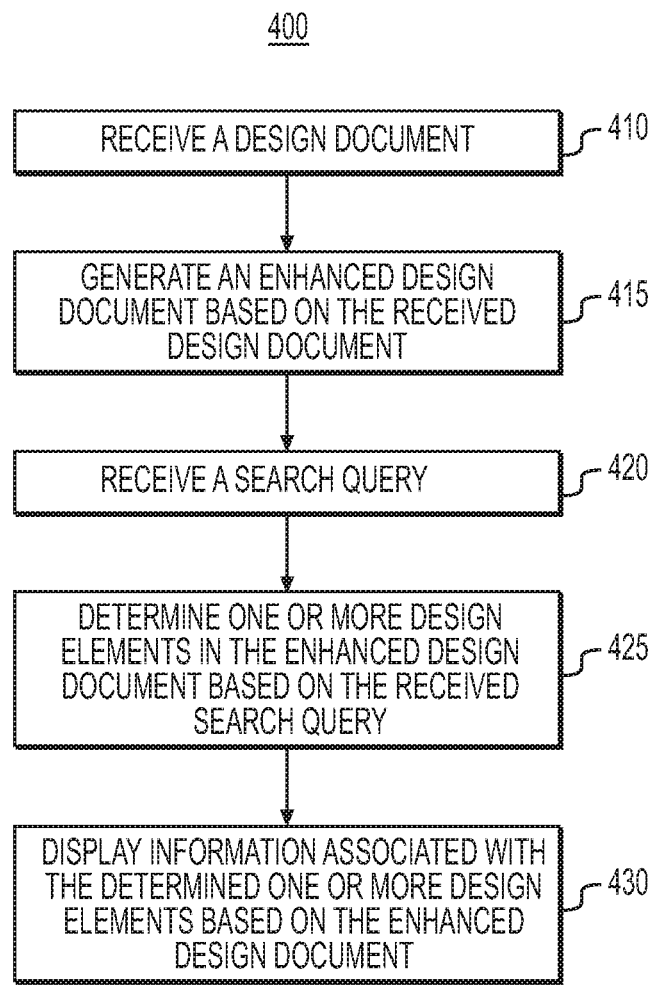
FIG. 4 is a flowchart illustrating an exemplary method of searching for one or more design elements in a 2D design document, according to one aspect of the present disclosure.

FIG. 4 is a flowchart illustrating an exemplary method of searching for one or more design elements in a 2D design document, according to one aspect of the present disclosure. In particular, the method 400 may be performed by the document review application 110, or the document review component 210 and design element detection component 220 therein. At step 410, the document review component 210 may receive a 2D design document. The 2D design document may be retrieved from a local or remote storage/computing system, may be received from a user via a peripheral device such as, e.g., a universal serial bus (USB), a scanner, an external hard drive, a disc storage, etc., or may be received via a user actually creating a 2D design document using the document review application 110. At step 415, the design element detection component 220 may generate an enhanced 2D design document based on the received 2D design document. The steps for generating the enhanced 2D design document (e.g., using machine learning techniques) will be described in greater detail in the following sections. At step 420, the document review component 210 may receive a search query. At step 425, the document review component 210 may determine one or more design elements in the enhanced 2D design document based on the received search query. In other words, the document review component 210 may determine one or more design elements (or the information pertaining to the one or more design elements) that correspond to the keyword(s), image data (e.g., thumbnail picture of a design element), or user selection of a design element in the 2D design document via user interface, etc. provided as the search query. In the case of a search query containing keyword(s), the design elements associated with the type(s) matching the keyword(s) may be determined. In the case of a non-text based search query, such as the image data or user-selected design element within the 2D design document as alluded to above, the document review application 110 may first determine the type/designation associated with the image data or user-selected design element using machine learning techniques. Then, the document review application 110 may find design elements in the enhanced 2D design document that are associated with a type/designation matching the determined type/designation of the image data or user-selected design element.

Then, at step 430, the document review component 210 may display information associated with the determined one or more design elements based on the enhanced 2D design document. As alluded to above, the enhanced 2D design document may be the 2D design document (i.e., an electronic document that includes a 2D image of a design project) augmented with information pertaining to one or more design elements detected within the 2D image. The information pertaining to each detected design element may include a location of the design element within the 2D image, a type of the design element, and other properties associated with the design element that are found as results of the detection. Therefore, the information displayed at step 430 may comprise the location, the type, and/or any other property associated with each determined design element. The manner in which the information may be displayed is described above in reference to FIG. 3, as an example.

In some embodiments, the document review component 210 may additionally or alternatively display information that is further determined or deduced from the information contained in the enhanced 2D design document. For example, based on the number of design elements detected for each type/designation, the document review component 210 may display the total count for each type of detected design elements. As another example, in response to a user request for an ADA validation, the document review component 210 may analyze the information contained in the enhanced 2D design document (e.g., locations, types, etc. of the design elements) to determine whether the project design complies with the ADA standards, and output the validation results.

Figure 5:
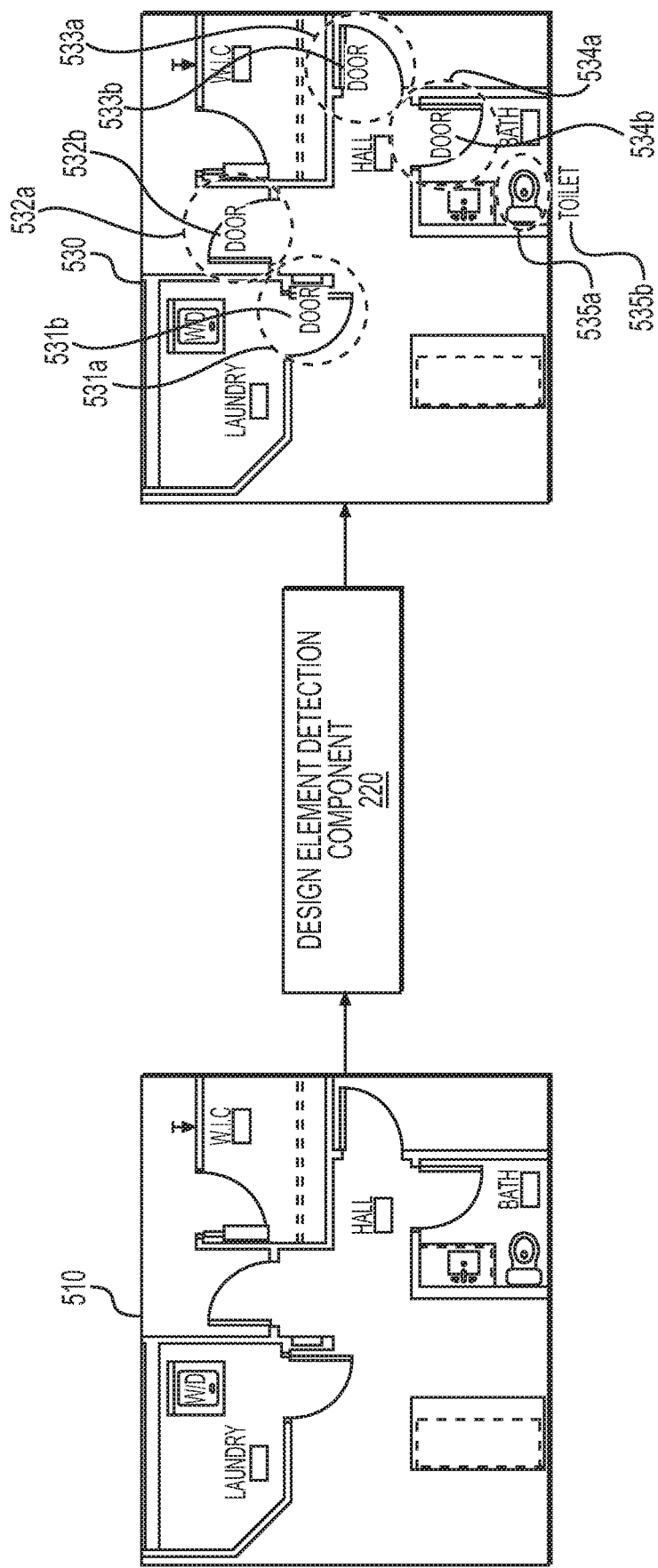
FIG. 5 illustrates a flow of data being input to and output from a design element detection component of an exemplary document review application, according to one aspect of the present disclosure.

FIG. 5 illustrates a flow of data being input to and output from a design element detection component 220 of an exemplary document review application 110, according to one aspect of the present disclosure. Notably, FIG. 5 illustrates a data flow during the process of generating an enhanced 2D design document by the design element detection component 220. First, a 2D design document 510 may be input to the design element detection component 220. As alluded to above, the 2D design document 510 may be received from a local or remote storage/computing system, from a user via a peripheral device, or via a user actually creating the 2D design document 510 using the document review application 110. Upon receiving the 2D design document 510, the design element detection component 220 may process the 2D design document 510 using machine learning techniques, in order to detect one or more design elements within the 2D design document 510. Once the design elements are detected and information related to the design elements collected, the design element detection component 220 may output an enhanced 2D design document 530, which is a 2D design document 510 augmented with information pertaining to the detected design elements. For example, the enhanced 2D design document 530 may indicate the locations of the detected design elements (e.g., some or all doors 531*a*, 532*a*, 533*a*, 534*a*, 535*a*) and the types/designations of the detected design elements (e.g., some or all door labels 531*b*, 532*b*, 533*b*, 534*b*, 535*b*). In one embodiment, the information pertaining to the detected design elements and the inputted 2D design document 510 may be merged to generate the enhanced 2D design document 530. In other embodiments, a separate copy of the enhanced 2D design document 530 may be generated, in addition to the 2D design document 510 provided as the input. It should also be noted that, the information pertaining to the detected design element (i.e., augmented information) may not be immediately displayed or provided within the document review application 110. In other words, the augmented information may merely be stored in association with the enhanced 2D design document 530 initially, and may be displayed selectively via the document review application 110, for example, in response to a search query. Again, the manner in which the augmented information may be displayed is described above in reference to FIG. 3. For example, each of the dotted circles 311*a*, 312*a*, 313*a*, 314*a* in FIG. 3 may be placed visually on top of the 2D design document 310 using the location information pertaining to each corresponding design element, which is included in the enhanced 2D design document. Similarly, each of the types/designations 311*b*, 312*b*, 313*b*, 314*b* may be placed visually on top of the 2D design document 310 in accordance with the type/designation of each corresponding design element identified in the enhanced 2D design document.

Figures 6, 7:
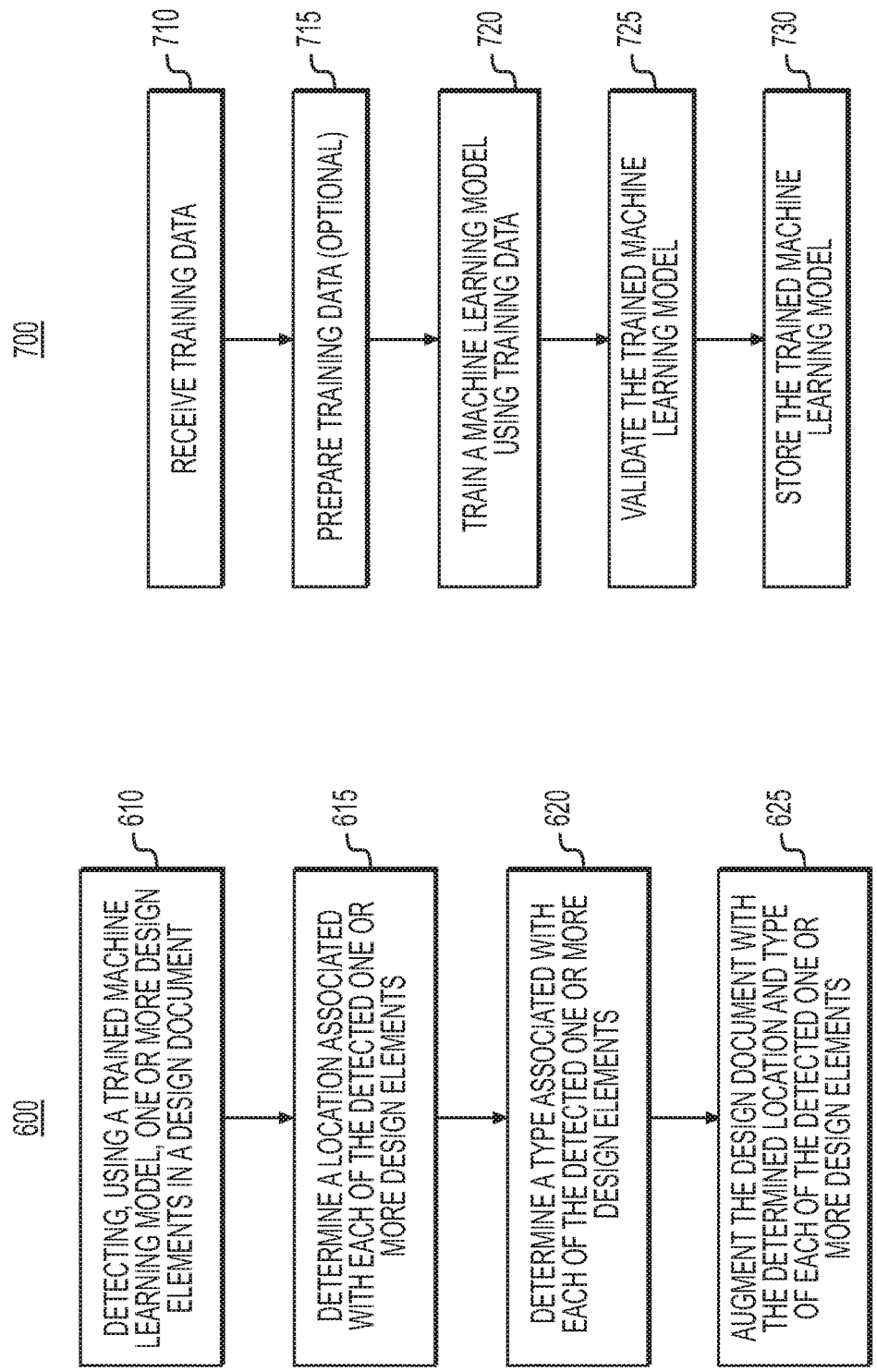
FIG. 6 is a flowchart illustrating an exemplary method of generating an enhanced 2D design document, according to one aspect of the present disclosure.
FIG. 7 is a flowchart illustrating an exemplary method of training a machine learning model, according to one aspect of the present disclosure.

FIG. 6 is a flowchart illustrating an exemplary method of generating an enhanced 2D design document, according to one aspect of the present disclosure. In particular, the method 600 may be performed by the document review application 110, or the design element detection component 220 therein. The steps laid out in FIG. 6 may correspond to step 415 in FIG. 4 concerning generation of an enhanced design document based on a 2D design document. At step 610, the design element detection component 220 may detect, using a trained machine learning model, one or more design elements in a received design document (e.g., the 2D design document received at step 410 in FIG. 4.). The machine learning techniques used to detect the design elements may comprise any machine learning techniques suitable for detecting objects in visual contents/files, such as documents, images, pictures, drawings, media files, etc. However, more suitable or recommended machine learning techniques will be discussed in detail below. At step 615, the design element detection component 220 may determine a location associated with each of the detected one or more design elements. The determined location may identify the position of each detected design elements within the 2D design document. For example, the determined location may comprise x and y coordinates representative of the design element's distance from a corner edge of the 2D design document. However, any suitable methodology capable of accurately representing the position of each design element may be used. At step 620, the design element detection component 220 may determine a type (or designation) associated with each of the detected one or more design elements. The type or designation may be identified by the trained machine learning model, which may be configured to distinguish between various design elements based on visual features and classify each design element under a type or designation. At step 625, the design element detection component 220 may augment the 2D design document with the determined location and type of each of the detected one or more design elements, essentially generating an enhanced 2D design document.

As alluded to above in reference to step 425 in FIG. 4, the trained machine learning model may also be used by the document review application 110 (or any of the modules implemented therein) to interpret the search query provided by the user, especially in the case of non-text based search queries such as image data or user-selected design element within the 2D design document. For example, using the trained machine learning model, the document review application 110 may determine the type/designation associated with the image data or user-selected design element, which was provided as the search query.

FIG. 7 is a flowchart illustrating an exemplary method of training a machine learning model, according to one aspect of the present disclosure. Notably, the steps of method 700 may be performed by the model training system 120. However, it should be appreciated that the steps of method 700 may also be performed locally by the document review application 110.

One of the machine learning techniques that may be useful and effective for object detection is a convolutional neural network (CNN), which is a type of supervised machine learning. In the CNN, an image data (e.g., an image of a design element in a design document) may be input and passed through various convolutional layers and pooling layers. The CNN applies a series of filters to the raw pixel data of the image to extract and learn higher-level features, which the model may then use for classification. Typically, a CNN may be composed of a stack of convolutional modules that perform feature extraction, with each module consisting of a convolutional layer followed by a pooling layer. The last convolutional module may be followed by one or more dense layers that perform classification. The types of the CNN which can be implemented with the embodiments contemplated herein may include a region-based CNN (RCNN), fast RCNN, and faster RCNN. More specifically, the CNN may be constructed in Python with the TensorFlow framework.

Nonetheless, it should be noted that other machine learning techniques and frameworks may be used to perform the design element detection contemplated by the present disclosure. For example, the detection may be realized using other types of supervised machine learning such as regression problems, random forest, etc., using unsupervised machine learning such as cluster algorithms, principal component analysis (PCA), etc., and/or using reinforcement learning.

With renewed reference to FIG. 7, at step 710, the model training system 120 may receive training data 135 from the training data collection system 130. The training data collection system 130 can be considered as a centralized or distributed storage system on the network 150 that collects and stores training data 135 received from networked computing devices and/or entities. In some embodiments, however, the training data 135 may be received directly from a computing device of an entity that gathers the training data 135 and/or from a computing device configured to automatically extract the training data 135 from available sources. As alluded to above, the training data 135 may comprise image data (e.g., thumbnail picture) of a design element labeled with the type/designation of the design element. Such training data may be manually gathered and processed by a user using a computing device consistent with or similar to that depicted in FIG. 13, and/or may be automatically extracted from an enhanced sample design document using a computing device consistent with or similar to that depicted in FIG. 13, as will be described in further detail below. At step 715, which may be optional depending on the state of the received training data 135, the model training system 120 may prepare the received training data 135 for model training. Data preparation may involve randomizing the ordering of the training data 135, visualizing the training data 135 to identify relevant relationships between different variables, identifying any data imbalances, splitting the training data 135 into two parts where one part is for training a model and the other part is for validating the trained model, de-duplicating, normalizing, correcting errors in the training data 135, and so on. Data preparation may also involve pre-processing image data, before any image data is fed into a machine learning algorithm. However, such pre-processing may not be needed especially with deep learning (e.g., neural networks), as filters in the neural networks may learn on the provided data set.

At step 720, the model building system 120 may train a machine learning model using the training data. The trained machine learning model could analyze a design document to detect one or more design elements and their respective types/designations. At step 725, the model building system 120 may validate the trained machine learning model. For example, the machine learning model may be validated by analyzing a set of training data that are known to represent certain object classes (e.g., certain design element types). Accordingly, the accuracy of the machine learning model may be determined. Once the validation step is complete, at step 730, the model building system 120 may store the trained (and validated) machine learning model in a system memory or storage. The trained machine learning model may then be transmitted to and used by the document review application 110 to detect various types of design elements in a design document.

Figure 8:
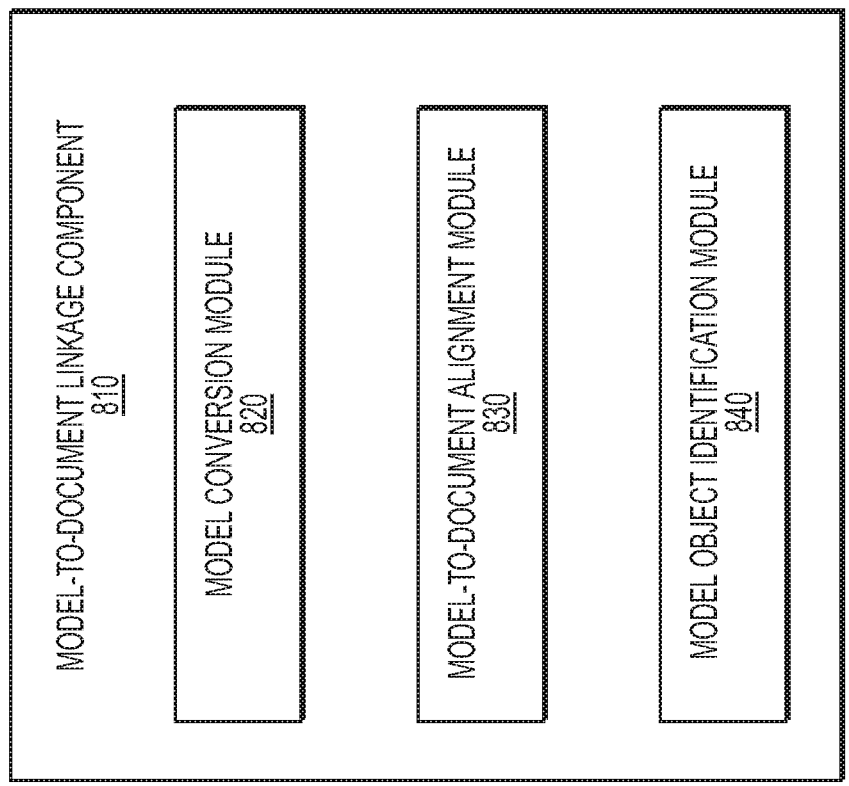
FIG. 8 shows a block diagram of an exemplary model-to-document linkage component, according to one aspect of the present disclosure.
Figure 9A:
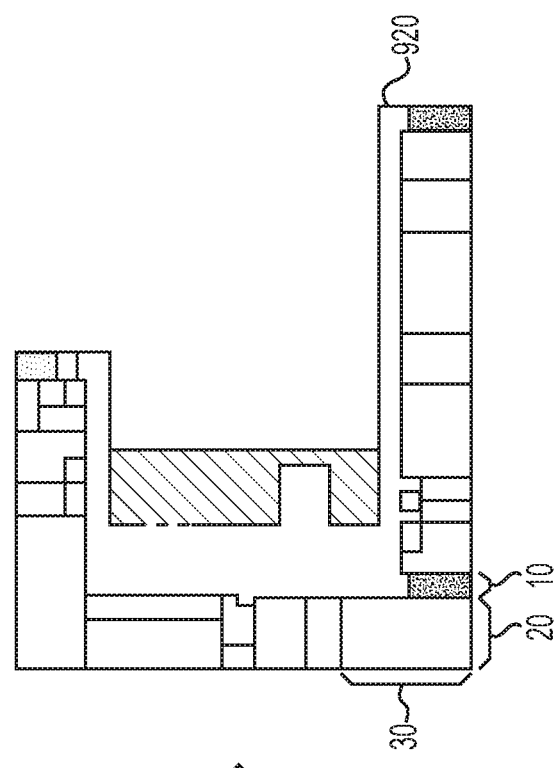
FIGS. 9A-9C illustrate the functions performed by various modules of an exemplary model-to-document linkage component, according to one aspect of the present disclosure.
Figure 9A:
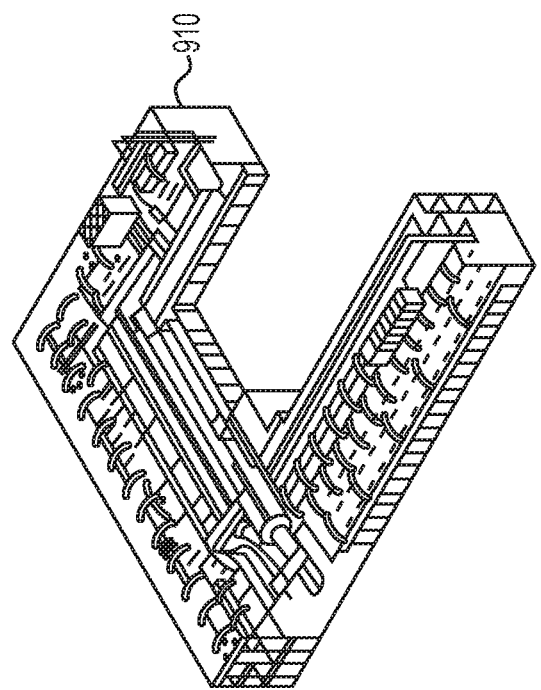
Figure 9B:
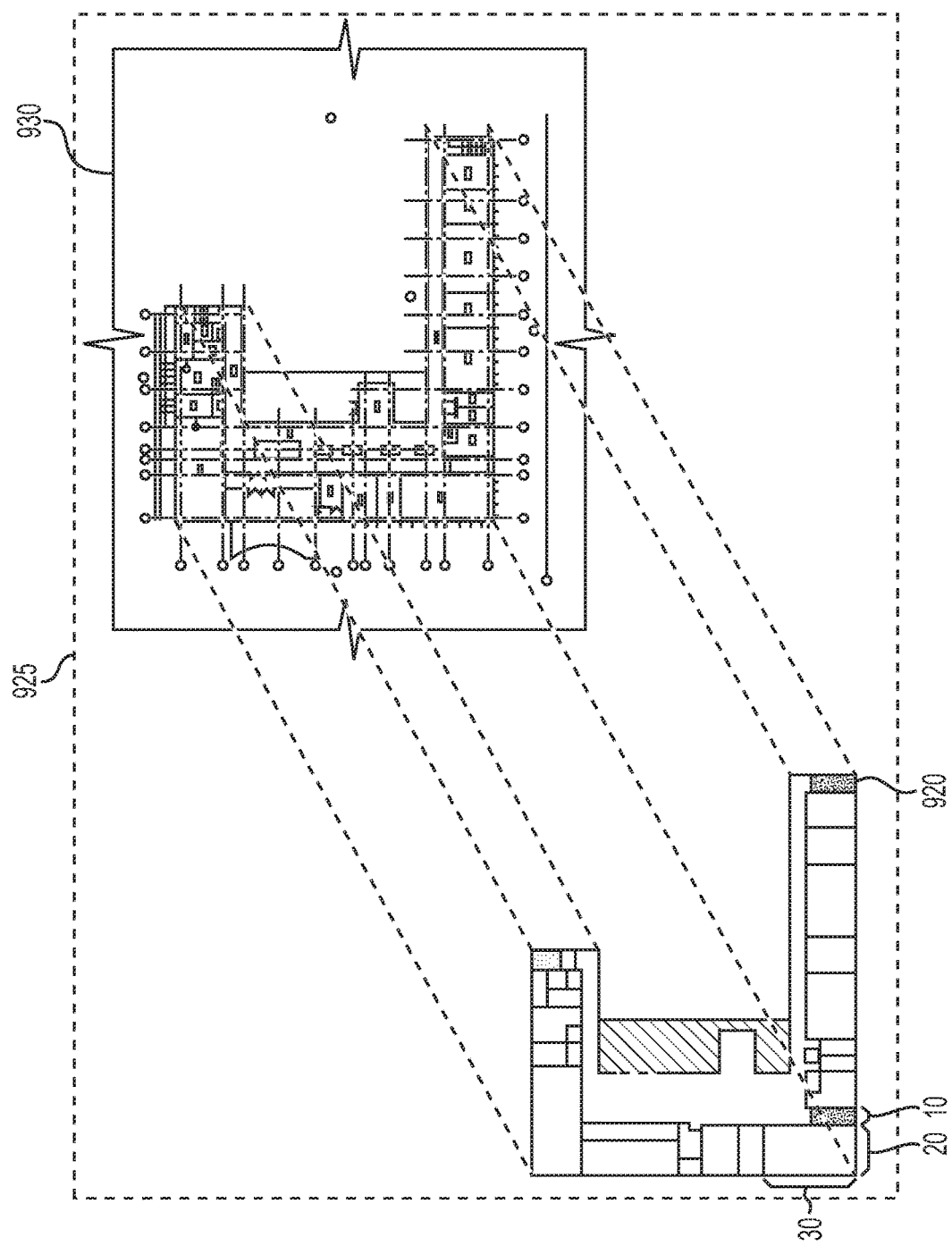
Figure 9C:
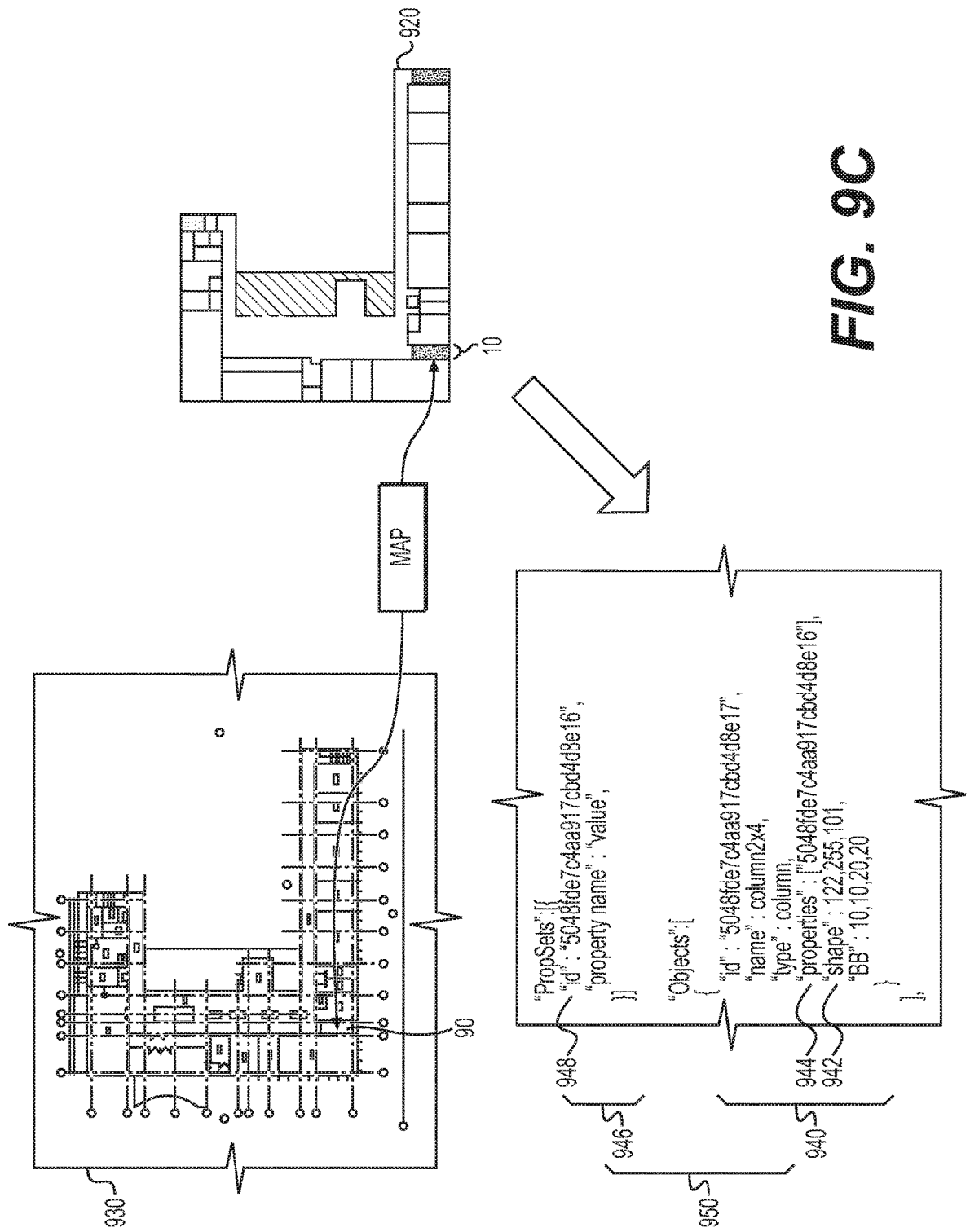

FIG. 8 shows a block diagram of an exemplary model-to-document linkage component 810, according to one aspect of the present disclosure. Notably, data output from the model-to-document linkage component 810, such as the enhanced sample design document, may be used to train a machine learning model (i.e., used as training data 135) as discussed above in reference to FIG. 7. The model-to-document linkage component 810 may be installed on a computing device consistent with or similar to that depicted in FIG. 13 and resident on the network 150. In some embodiments, the model-to-document linkage component 810 may be implemented in the training data collection system 130 or model training system 120. However, the model-to-document linkage component 810 may be implemented in a computing device separate from the training data collection system 130 or model training system 120. In general, the model-to-document linkage component 810 may comprise a model conversion module 820, a model-to-document alignment module 830, and a model object identification module 840. FIGS. 9A-9C illustrate the functions performed by the model conversion module 820, model-to-document alignment module 830, and/or model object identification module 840, according to one aspect of the present disclosure. In the discussion below, references will be made to both FIG. 8 and FIGS. 9A-9C.

The model-to-document linkage component 810 may establish a linkage between a sample design document (i.e., a 2D sample design document) and a 3D design file, such that information stored in the 3D design file may be selectively mapped to the sample design document (or to the appropriate sample design elements included therein). The 3D design file may be a BIM file, or any data file that includes a 3D design model, the 3D design model comprising design elements (e.g., walls, column, stairways, doors, windows, etc.) and information relevant to the design elements. The design elements in the 3D design model may thus be 3D design elements. In the 3D design file, the information relevant to each 3D design element may be stored as a design element data set. The sample design document may comprise a sample design image (i.e., a 2D sample design image) including one or more images of sample design elements (i.e., 2D sample design elements). The sample design document may also comprise supplemental information, such as annotations added by a user. The sample design document may be, for example, a PDF document. In one embodiment, the information contained in the 3D design file may be more comprehensive and extensive compared to the information contained in the sample design document. However, in some cases, the information contained in the 3D design file may not be more comprehensive or extensive compared to the information contained in the sample design document.

While techniques discussed herein may refer to various steps being performed by different modules, such as the model conversion module 820, model-to-document alignment module 830, and model object identification module 840, such steps may be performed by any module or software component discussed herein, on one or multiple computers, may be performed by one or across multiple devices, and/or within a single or across multiple software applications.

The model conversion module 820 may convert a 3D design model 910 in the 3D design file to a color-coded 2D design image 920, as shown in FIG. 9A, in order to assign unique identifiers to the 3D design elements in the 3D design model 910. While color coding will be frequently be discussed herein, any indicators may be used with conversion techniques performed by the model conversion module 820. For example, patterns, shapes, tags, alphanumeric or other characters, tooltips, symbols, etc., may be used as indicators. In other words, the color or other indicator of a particular design element may uniquely identify that design element.

The 3D design file and the 3D design model 910 contained therein may be retrieved from a local or remote storage (e.g., automatically or based on user selection), or may be received from a user via the computer's input/output (I/O) interface. While the 3D design model 910 may be converted to a color-coded 2D design image 920, the original 3D design model 910 may be retained for further usage and data gathering. The color-coded 2D design image 920 may be generated by projecting the 3D design model 910 onto a 2D space to create a 2D design image, which is a 2D visual representation of the 3D design model 910, and assigning a color to each design element in the created 2D design image. As alluded to above, a design element may be a line, a set of lines, a geometrical shape, or a polygon that represents an object within a design image, such as a wall, column, stairway, door, toilet, sink, window, etc. The assigned color may be represented as an RGB value, and the RGB value may be used as a unique identifier for the design element to which the color is assigned. The colored design elements in the 2D design image may be referred to as color-coded 2D design elements (e.g., color-coded 2D design elements 10, 20, and 30) throughout the disclosure. The 2D design image that comprises the color-coded 2D design elements may thus be referred to as the color-coded 2D design image 920, as alluded to above.

The color-coded 2D design image 920 shown in FIG. 9A may comprise a plurality of color-coded 2D design elements (e.g., color-coded 2D design elements 10, 20, and 30), although FIG. 9A is shown in black and white. For example, the color-coded 2D design element 10 may represent a column or pillar in a building, and may take the form of a rectangle filled with green color. The color-coded 2D design element 20, the straight line between the color-coded design elements 10 and 30, may represent a wall in the building, and may be colored blue. The color-coded 2D design element 30 may represent a window in the building, and may be a straight line colored yellow. Although only the color-coded 2D design elements 10, 20, and 30 are specifically described, it should be recognized that, as shown in FIG. 9A, the color-coded 2D design image 920 may comprise other color-coded 2D design elements, each representing a particular design element with a distinct color, shape, pattern, and/or size. Notably, the color or other indicator of a particular design element may uniquely identify that design element.

The unique identifier (i.e., the RGB value) generated from each color-coded 2D design element may be stored in association with the corresponding 3D design element in the 3D design file (e.g., a BIM file). An example of a unique identifier stored in the 3D design file is depicted in FIG. 9C. For example, the unique identifier 942 shown in FIG. 9C comprises an RGB value of "122, 255, 101" stored in association with the design element "column2×4." Such a unique identifier may be generated for each design element in the color-coded 2D design image 920 and may be stored in association with the corresponding 3D design element in the 3D design file. For instance, the unique identifier may be stored in the design element data set 950, which stores information relevant to the corresponding 3D design element.

With renewed reference to FIG. 8, the model-to-document alignment module 830 may align a sample design image (i.e., a 2D sample design image) 930 with a color-coded 2D design image 920, as shown in FIG. 9B. As will be explained in greater detail in the following sections, aligning the sample design image 930 with the color-coded 2D design image 920 may enable the model object identification module 840 to map each sample design element (i.e., 2D sample design element) in the sample design image 930 to a corresponding color-coded 2D design element in the color-coded 2D design image 920. A sample design document (e.g., a PDF document) containing the sample design image 930 may be retrieved from a local or remote storage (e.g., automatically or based on user selection), or directly from the user via the computer's I/O interface.

In one embodiment, to align the sample design image 930 with the color-coded 2D design image 920, the model-to-document alignment module 830 may generate a barcode-type representation of each of the sample design image 930 and the color-coded 2D design image 920. For the sake of brevity, the barcode-type representation will be referred to as a barcode throughout the disclosure. For example, a barcode may be generated by scanning vertical lines from the leftmost column to the rightmost column of an image, counting the number of pixels in each vertical line, normalizing the pixel count in each vertical line based on a 256 scale, or, for example, some other power of two, and using the normalized pixel count for each barcode line (i.e., barcode line value) in the barcode. Once the barcodes of both the sample design image 930 and the color-coded 2D design image 920 have been determined, the two barcodes may be aligned by comparing the barcode line values and determining a matching pattern in the change of the barcode line values across the barcodes. In other embodiments, however, an alignment technique that is different from the above-described technique utilizing barcodes may be used. In other words, any alignment technique suitable for aligning two or more images that represent the same or substantially similar object(s) may be used to align the sample design image 930 and the color-coded 2D design image 920. The data representing the alignment (i.e., alignment data 925) may be stored in a local and/or remote storage for subsequent uses.

With renewed reference to FIG. 8, the model object identification module 840 may map each sample design element in the sample design image 930 to a corresponding color-coded 2D design element in the color-coded 2D design image 920 using the alignment data 925, as shown in FIG. 9C. For example, the sample design element 90 in the sample design image 930 may be mapped to the corresponding color-coded 2D design element 10 in the color-coded 2D design image 920 using the alignment data 925. Based on the mapping, the model object identification module 840 may further identify a 3D design element (or the design element data set storing the information relevant to the 3D design element) in the 3D design file that corresponds to each sample design element in the sample design image 930. The identification of the 3D design element in the 3D design file may enable augmentation of additional and/or more detailed information to the sample design document containing the sample design image 930.

More specifically, the model object identification module 840 may identify a 3D design element (or the design element data set 950 storing the information relevant to the 3D design element) in the 3D design file that corresponds to the sample design element 90 in the sample design image 930 by i) determining an RGB value of the color-coded 2D design element 10 that aligns with and mapped to the sample design element 90, ii) using the RGB value, or other indicator value, to identify a matching unique identifier 942 in the 3D design file, and iii) identifying the design element data set 950 as the data set pertaining to the sample design element 90 in the sample design image 930.

The identification of the design element data set 950 may involve two steps, each step being directed to identifying a subset of the design element data set 950. The design element data set 950 associated with a 3D design element may comprise a design element identification data set 940 and a design element property data set 946. The design element identification data set 940 may comprise various types of information that, individually or in combination, uniquely identifies the associated 3D design element. For example, the design element identification data set 940 may comprise, among other things, a property identifier 944 and/or a unique identifier 942 associated with the 3D design element. The design element property data set 946 may comprise properties and corresponding property values associated with the 3D design element. Various properties of a 3D design element may comprise shape properties such as width, height, length, perimeter, min and max plate thickness, and cross section area, physical values of material such as weight, mass-density, and porosity, relations to other design element such as spatial containment, aggregation and connection, and time-related values such as cost schedule and work schedule, etc. The design element property data set 946 may also comprise a property identifier 948 that may match with the property identifier 944 stored in the design element identification data set 940, such that one of the data sets 946 or 940 may be located by using a property identifier stored in the other data set.

Upon determining the RGB value of the color-coded 2D design element 10 corresponding to the sample design element 90, the model object identification module 840 may locate the unique identifier 942 in the 3D design file that matches the RGB or other indicator value. For the purpose of describing the model object identification step, it will be assumed that the RGB value pertaining to the color-coded 2D design element 10 is "122, 255, 101." Using this RGB value, the matching unique identifier 942 (which was previously generated and stored in the 3D design file by the model conversion module 820) may be located within the design element identification data set 940. The model object identification module 840 may then use the property identifier 944 stored in the design element identification data set 940 to locate the corresponding design element property data set 946 that contains the matching property identifier 948. Once the design element identification data set 940 and the design element property data set 946 are identified (i.e., once the design element data set 950 is identified), the model object identification module 840 may retrieve information associated with the design element from one or more of the identified data sets, and may augment the sample design document containing the sample design image 930.

Figure 10:
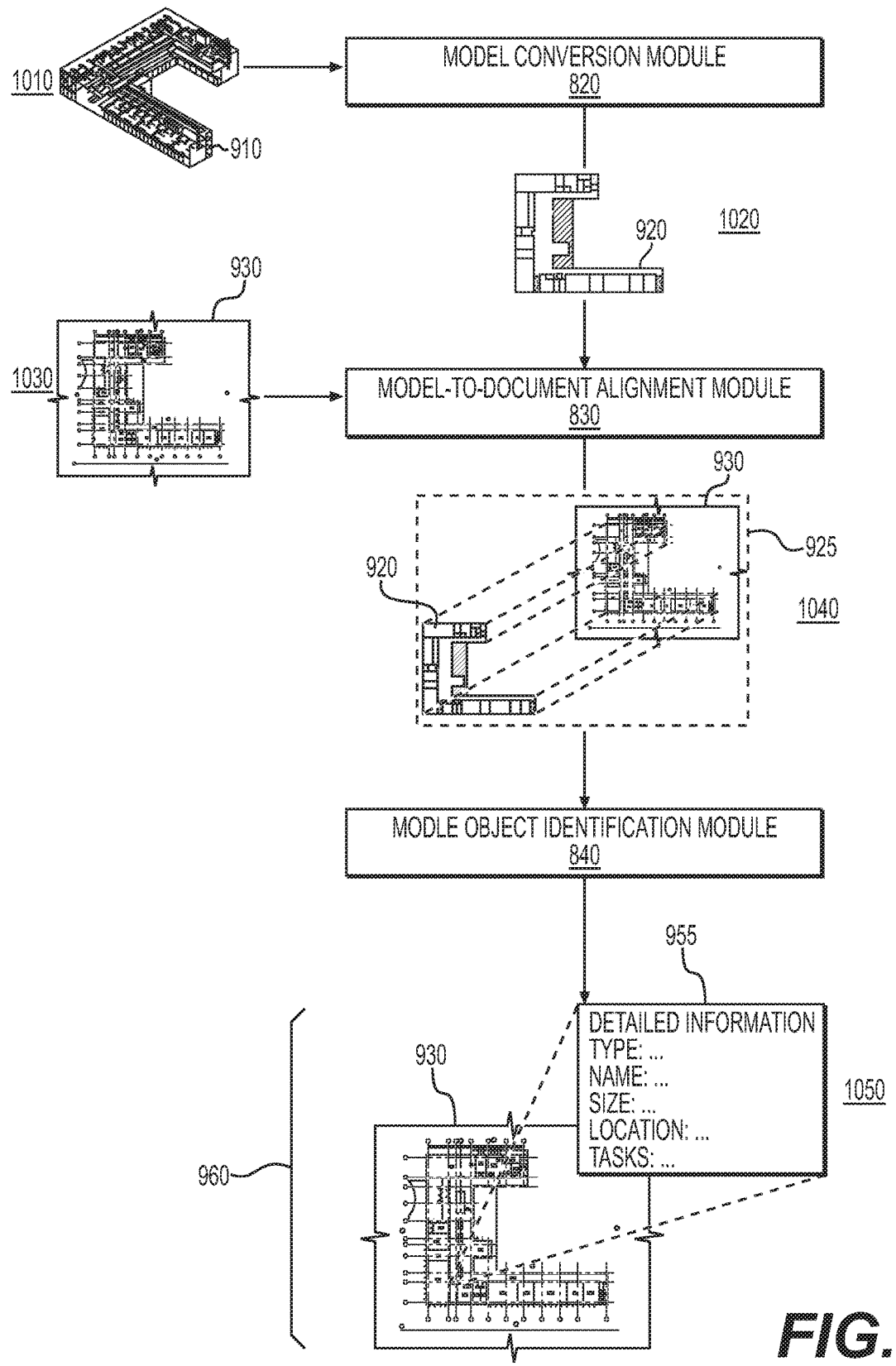
FIG. 10 illustrates a flow of data being input to and output from individual modules of an exemplary model-to-document linkage component, according to one aspect of the present disclosure.

FIG. 10 illustrates a flow of data being input to and output from individual modules 820, 830, 840 of an exemplary model-to-document linkage component 810, according to one aspect of the present disclosure. Notably, FIG. 10 illustrates a data flow during the process of identifying a 3D design element in a 3D design file that corresponds to a sample design element in a sample design document. At step 1010, a 3D design model 910 may be input to the model conversion module 820. As alluded to above, a 3D design file containing the 3D design model 910 may be received from a user or retrieved from a local and/or remote storage. The model conversion module 820 may generate a color-coded 2D design image 920 based on the received 3D design model 910. At step 1020, the color-coded 2D design image 920 may be input to the model-to-document alignment module 830. At step 1030, a sample design document containing a sample design image 930 may also be input to the model-to-document alignment module 830. As alluded to above, the sample design document containing the sample design image 930 may be received from a user or retrieved from a local and/or remote storage automatically or based on user selection. Steps 1020 and 1030 may take place simultaneously or one after another. The model-to-document alignment module 830 may align the sample design image 930 with the color-coded 2D design image 920, and store data representing the alignment (i.e., alignment data 925) in a local and/or remote storage, as described above. At step 1040, the alignment data 925 may be input to the model object identification module 840. At step 1050, the model object identification module 840 may then map each sample design element in the sample design image 930 with a corresponded color-coded 2D design element in the color-coded 2D design image 920, using the alignment data 925. Further, the model object identification module 840 may determine a design element data set in the 3D design file that corresponds to each sample design element, using the RBG or other indicator value associated with a color-coded 2D design element that is mapped with the sample design element. Finally, the sample design document containing the sample design image 930 may be augmented with information retrieved from the design element data set determined for each sample design element (e.g., detailed information 955). The sample design document augmented with this additional information may constitute the enhanced sample design document 960.

Figure 11:
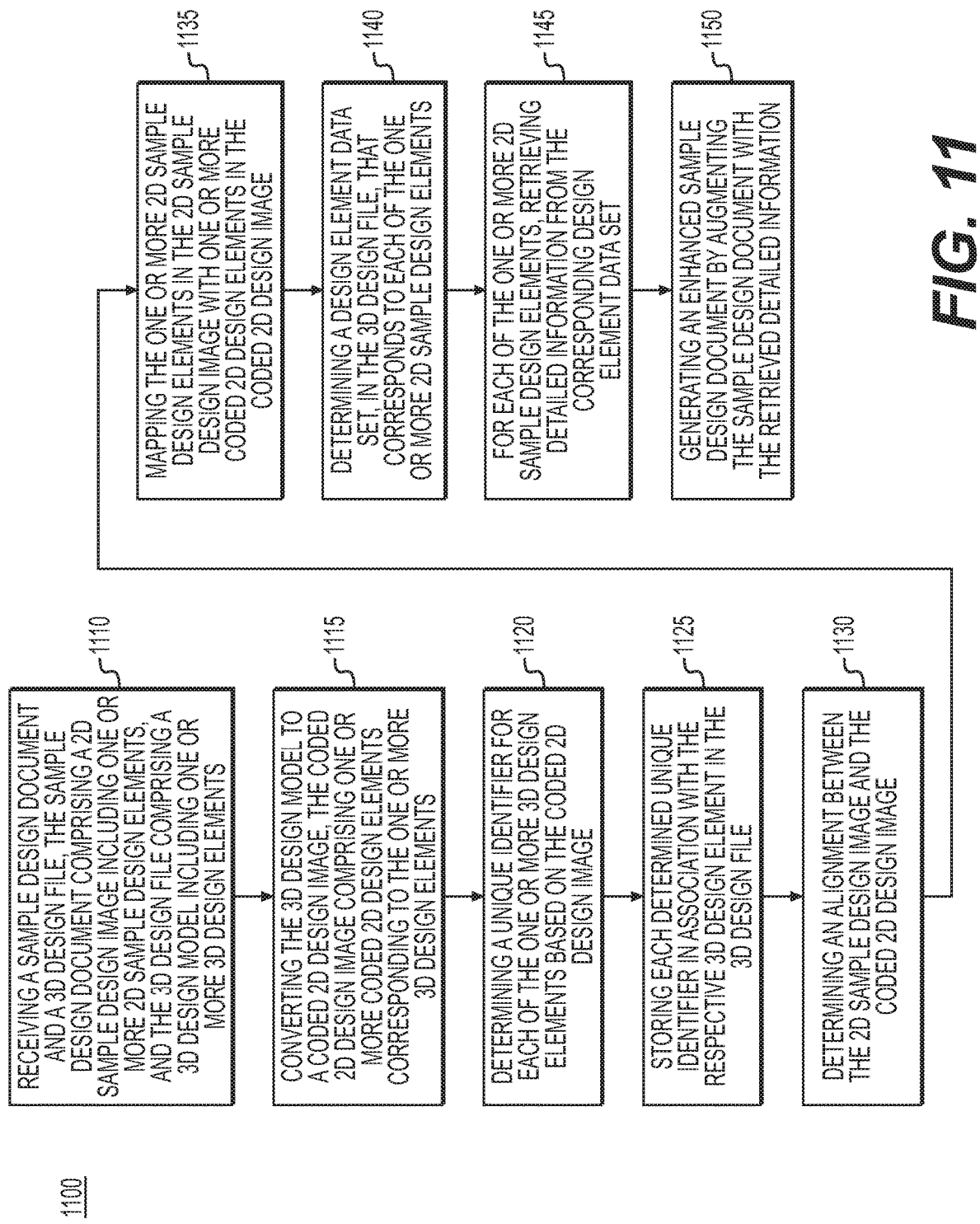
FIG. 11 is a flowchart illustrating an exemplary method of identifying a 3D design element in a 3D design file that corresponds to a sample design element in a sample design document, according to one aspect of the present disclosure.

FIG. 11 is a flowchart illustrating an exemplary method of identifying a 3D design element in a 3D design file that corresponds to a sample design element in a sample design document, according to one aspect of the present disclosure. In particular, the method 1100 may be performed by the model-to-document linkage component 810 implemented on a computing device or a server. At step 1110, the model-to-document linkage component 810 may receive a sample design document and a 3D design file. The sample design document may comprise a sample design image 930 including one or more sample design elements. The 3D design file may comprise a 3D design model 910 including one or more 3D design elements, and information pertaining to each of the one or more 3D design elements stored as a design element data set. At step 1115, the model-to-document linkage component 810 may convert the 3D design model 910 to a coded 2D design image 920. The coded 2D design image 920 may comprise one or more coded 2D design elements corresponding to the one or more 3D design elements in the 3D design model 910. As discussed to above, in one embodiment, the coded 2D design image 920 may be color-coded, meaning the one or more coded 2D design elements therein may be color-coded. However, each of the one or more coded 2D design elements may be coded using any indicator that uniquely identifies the corresponding 2D design element, such as, e.g., patterns, shapes, tags, alphanumeric or other characters, tooltips, symbols, etc. At step 1120, the model-to-document linkage component 810 may determine a unique identifier for each of the one or more 3D design elements in the 3D design model 910 based on the coded 2D design image 920. More specifically, the model-to-document linkage component 810 may determine a unique identifier for each of the one or more 3D design elements in the 3D design model 910 based on a code (e.g., color) of a coded 2D design element (e.g., color-coded 2D design element) that corresponds to the respective 3D design element. At step 1125, the model-to-document linkage component 810 may store each generated unique identifier in association with the respective 3D design element in the 3D design file (e.g., unique identifier 942 in FIG. 9C).

At step 1130, the model-to-document linkage component 810 may determine an alignment between the sample design image 930 and the coded 2D design image 920. The alignment data 925 may be stored for use in the subsequent steps of the method 1100. At step 1135, the model-to-document linkage component 810 may map each of the one or more sample design elements in the sample design image 930 with a corresponding 2D design element in the coded 2D design image 920, using the alignment data 925. At step 1140, the model-to-document linkage component 810 may determine, for each of the one or more sample design elements, a corresponding design element data set in the 3D design file. As explained above in reference to FIG. 9C, the corresponding design element data set for each sample design element may be identified using the RGB or indicator value associated with the coded 2D design element that is mapped with the sample design element. At step 1145, the model-to-document linkage component 810 may retrieve, for each of the one or more sample design elements, detailed information from the corresponding design element data set. At step 1150, the model-to-document linkage component 810 may generate an enhanced sample design document 960 by augmenting the sample design document 930 with the retrieved detailed information 955. For example, the enhanced sample design document 960 may include the sample design image 930 with all of the detected sample design elements labeled, tagged, or linked with the respective types/designations. Furthermore, the enhanced sample design document 960 may include information specifying the respective locations of the detected sample design elements. The determined location may identify the position of each detected design elements within the 2D sample design image 930. For example, the location information may comprise x and y coordinates representative of the sample design element's distance from a corner edge of the sample design image 930. However, any suitable methodology capable of accurately representing the position of each sample design element may be used.

The enhanced sample design document 960 initially may not be suitable for training the machine learning model, as the enhanced sample design document 960 may contain extra information which may not be needed for training. Therefore, only the information needed for training may be extracted from the enhanced sample design document 960. For example, each set of training data 135 may require an image of a design element and a type/designation associated with the design element. In that case, the image and type/designation of each sample design element may be extracted from the enhanced sample design document 960. Nonetheless, it should be noted that additional information may be extracted from the enhanced sample design document 960, based on the requirement defining what types of data should be included in the training data 135. The extraction step may be performed by the model object identification module 840, or may be performed later at the training data collection system 130 or model training system 120.

FIG. 12 illustrates the above-described process of extracting images and types/designations of sample design elements from an enhanced sample design document, according to one aspect of the present disclosure. More specifically, a thumbnail picture of each sample design element (e.g., 121*a*) may be generated from the sample design image 930, along with the type/designation associated with the sample design element (e.g., 121*b*) from the retrieved information 955. The thumbnail pictures paired with the respective types/designations (i.e., labeled thumbnails) may be transmitted and/or stored to the training data collection system 130 as training data 135. Such training data 135 may then be used to train a machine learning model at the model training system 120.

Unless specifically stated otherwise, as apparent from the following discussions, it is appreciated that throughout the specification discussions utilizing terms such as "processing," "computing," "calculating," "determining", "analyzing" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer," a "computing machine," a "computing platform," a "computing device," or a "server" may include one or more processors.

FIG. 13 illustrates an implementation of a computer system that may execute techniques presented herein. The computer system 1300 can include a set of instructions that can be executed to cause the computer system 1300 to perform any one or more of the methods or computer based functions disclosed herein. The computer system 1300 may operate as a standalone device or may be connected, e.g., using a network, to other computer systems or peripheral devices.

In a networked deployment, the computer system 1300 may operate in the capacity of a server or as a client user computer in a server-client user network environment, or as a peer computer system in a peer-to-peer (or distributed) network environment. The computer system 1300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the computer system 1300 can be implemented using electronic devices that provide voice, video, or data communication. Further, while a single computer system 1300 is illustrated, the term "system" shall also be taken to include any collection of systems or sub-systems that individually or jointly execute a set, or multiple sets, of instructions to perform one or more computer functions.

As illustrated in FIG. 13, the computer system 1300 may include a processor 1302, e.g., a central processing unit (CPU), a graphics processing unit (GPU), or both. The processor 1302 may be a component in a variety of systems. For example, the processor 1302 may be part of a standard personal computer or a workstation. The processor 1302 may be one or more general processors, digital signal processors, application specific integrated circuits, field programmable gate arrays, servers, networks, digital circuits, analog circuits, combinations thereof, or other now known or later developed devices for analyzing and processing data. The processor 1302 may implement a software program, such as code generated manually (i.e., programmed).

The computer system 1300 may include a memory 1304 that can communicate via a bus 1308. The memory 1304 may be a main memory, a static memory, or a dynamic memory. The memory 1304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 1304 includes a cache or random-access memory for the processor 1302. In alternative implementations, the memory 1304 is separate from the processor 1302, such as a cache memory of a processor, the system memory, or other memory. The memory 1304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 1304 is operable to store instructions executable by the processor 1302. The functions, acts or tasks illustrated in the figures or described herein may be performed by the programmed processor 602 executing the instructions stored in the memory 1304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the computer system 1300 may further include a display unit 1310, such as a liquid crystal display (LCD), an organic light emitting diode (OLED), a flat panel display, a solid-state display, a cathode ray tube (CRT), a projector, a printer or other now known or later developed display device for outputting determined information. The display 1310 may act as an interface for the user to see the functioning of the processor 1302, or specifically as an interface with the software stored in the memory 1304 or in the drive unit 1306.

Additionally or alternatively, the computer system 1300 may include an input device 1312 configured to allow a user to interact with any of the components of system 1300. The input device 1312 may be a number pad, a keyboard, or a cursor control device, such as a mouse, or a joystick, touch screen display, remote control, or any other device operative to interact with the computer system 1300.

The computer system 1300 may also or alternatively include a disk or optical drive unit 1306. The disk drive unit 1306 may include a computer-readable medium 1322 in which one or more sets of instructions 1324, e.g. software, can be embedded. Further, the instructions 1324 may embody one or more of the methods or logic as described herein. The instructions 1324 may reside completely or partially within the memory 1304 and/or within the processor 1302 during execution by the computer system 1300. The memory 1304 and the processor 1302 also may include computer-readable media as discussed above.

In some systems, a computer-readable medium 1322 includes instructions 1324 or receives and executes instructions 1324 responsive to a propagated signal so that a device connected to a network 150 can communicate voice, video, audio, images, or any other data over the network 150. Further, the instructions 1324 may be transmitted or received over the network 150 via a communication port or interface 1320, and/or using a bus 1308. The communication port or interface 1320 may be a part of the processor 1302 or may be a separate component. The communication port 1320 may be created in software or may be a physical connection in hardware. The communication port 1320 may be configured to connect with a network 150, external media, the display 1310, or any other components in system 1300, or combinations thereof. The connection with the network 150 may be a physical connection, such as a wired Ethernet connection or may be established wirelessly as discussed below. Likewise, the additional connections with other components of the system 1300 may be physical connections or may be established wirelessly. The network 150 may alternatively be directly connected to the bus 1308.

While the computer-readable medium 1322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 1322 may be non-transitory, and may be tangible.

The computer-readable medium 1322 can include a solid-state memory such as a memory card or other package that houses one or more non-volatile read-only memories. The computer-readable medium 1322 can be a random-access memory or other volatile re-writable memory. Additionally or alternatively, the computer-readable medium 1322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The computer system 1300 may be connected to one or more networks 150. The network 150 may define one or more networks including wired or wireless networks. The wireless network may be a cellular telephone network, an 802.11, 802.16, 802.20, or WiMax network. Further, such networks may include a public network, such as the Internet, a private network, such as an intranet, or combinations thereof, and may utilize a variety of networking protocols now available or later developed including, but not limited to TCP/IP based networking protocols. The network 150 may include wide area networks (WAN), such as the Internet, local area networks (LAN), campus area networks, metropolitan area networks, a direct connection such as through a Universal Serial Bus (USB) port, or any other networks that may allow for data communication. The network 150 may be configured to couple one computing device to another computing device to enable communication of data between the devices. The network 150 may generally be enabled to employ any form of machine-readable media for communicating information from one device to another. The network 150 may include communication methods by which information may travel between computing devices. The network 150 may be divided into sub-networks. The sub-networks may allow access to all of the other components connected thereto or the sub-networks may restrict access between the components. The network 150 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component/object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the steps of methods discussed are performed in one embodiment by an appropriate processor (or processors) of a processing (i.e., computer) system executing instructions (computer-readable code) stored in storage. It will also be understood that the invention is not limited to any particular implementation or programming technique and that the invention may be implemented using any appropriate techniques for implementing the functionality described herein. The invention is not limited to any particular programming language or operating system.

It should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as falling within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

The above disclosed subject matter is to be considered illustrative, and not restrictive, and the appended claims are intended to cover all such modifications, enhancements, and other implementations, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description. While various implementations of the disclosure have been described, it will be apparent to those of ordinary skill in the art that many more implementations and implementations are possible within the scope of the disclosure. Accordingly, the disclosure is not to be restricted except in light of the attached claims and their equivalents.

What is claimed is:

1. A computer-implemented method for automatically detecting a design element in a design document, the method comprising:
   receiving a design document; and
   generating an enhanced design document based on the received design document by:
      receiving a sample design document and a design file, the sample design document comprises a sample design image including one or more sample design elements, and the design file comprises a design model including one or more model design elements;
      determining a design element data set, in the design file, that corresponds to each of the one or more sample design elements in the sample design image;
      retrieving detailed information from a corresponding design element data set for each of the one or more sample design elements in the sample design image;
      generating an enhanced sample design document by augmenting the sample design document with the detailed information for each of the one or more sample design elements;
      detecting, using a trained machine learning model, one or more design elements in the design document, wherein the trained machine learning model is trained using the sample design elements that are automatically extracted from the enhanced sample design document;
      determining a location associated with each of the detected one or more design elements;
      determining a type associated with each of the detected one or more design elements; and
      augmenting the design document with the determined location and type of each of the detected one or more design elements.

2. The computer-implemented method of claim 1, further comprising:
   receiving a user input;
   determining one or more design elements in the enhanced design document based on the received user input; and
   displaying information associated with the determined one or more design elements based on the enhanced design document.

3. The computer-implemented method of claim 1, wherein the trained machine learning model is a convolutional neural network model.

4. The computer-implemented method of claim 1, wherein prior to determining the design element data set, in the design file, that corresponds to each of the one or more sample design elements in the sample design image, the method comprises:
   converting the design model to a coded design image, the coded design image comprising one or more coded design elements corresponding to the one or more model design elements;
   determining a unique identifier for each of the one or more model design elements based on the coded design image;
   storing each determined unique identifier in association with the respective model design element in the design file;
   determining an alignment between the sample design image and the coded design image; and
   mapping the one or more sample design elements in the sample design image with the one or more coded design elements in the coded design image.

5. The computer-implemented method of claim 4, wherein the retrieved detailed information comprises a type associated with a corresponding sample design element of the corresponding design element data set, and wherein the trained machine learning model is also trained using types associated with the sample design elements, the types being automatically extracted from the enhanced sample design document.

6. The computer-implemented method of claim 4, wherein the unique identifier for each of the one or more model design elements is determined based on a code of a coded design element of the one or more coded design elements, the code corresponding to a model design element of the one or more model design elements.

7. The computer-implemented method of claim 2, wherein displaying the information associated with the determined one or more design elements based on the enhanced design document comprises at least one of:
   highlighting the determined one or more design elements on the enhanced design document; and
   displaying a type associated with each of the determined one or more design elements on the enhanced design document.

8. The computer-implemented method of claim 2, wherein the user input comprises at least one of: one or more keywords, an image data element, a user-selected design element in the design document, or an Americans with Disabilities Act (ADA) validation request.

9. A system for automatically detecting a design element in a design document, the system comprising:
   one or more processors; and
   one or more storage devices storing instructions that, when executed by the one or more processors, cause the one or more processors to perform a method comprising:
      receiving a design document; and
      generating an enhanced design document based on the received design document by:
         receiving a sample design image including sample design elements, and a design model including model design elements;
         determining a design element data set, in the design file, that corresponds to each of the one or more sample design elements;
         retrieving detailed information from a corresponding design element data set for each of the sample design elements;
         generating an enhanced sample design document by augmenting the sample design image with the detailed information for each of the sample design elements;
         detecting, using a trained machine learning model, one or more design elements in the design document, wherein the trained machine learning model is trained using the sample design elements that are automatically extracted from the enhanced sample design document;
         determining a location associated with each of the detected one or more design elements;
         determining a type associated with each of the detected one or more design elements; and
         augmenting the design document with the determined location and type of each of the detected one or more design elements.

10. The system of claim 9, wherein the method further comprises:
    receiving a search query;
    determining one or more design elements in the enhanced design document based on the received search query; and
    displaying information associated with the determined one or more design elements based on the enhanced design document.

11. The system of claim 9, wherein the trained machine learning model is a convolutional neural network model.

12. A non-transitory computer readable medium for automatically detecting a design element in a design document, the non-transitory computer readable medium storing instructions that, when executed by one or more processors, cause the one or more processors to perform a method comprising:
    receiving a design document; and
    generating an enhanced design document based on the received design document by:
       receiving a sample design image including sample design elements, and a design model including model design elements;
       determining a design element data set, in the design file, that corresponds to each of the one or more sample design elements;
       retrieving detailed information from a corresponding design element data set for each of the sample design elements;
       generating an enhanced sample design document by augmenting the sample design image with the detailed information for each of the sample design elements;
       detecting, using a trained machine learning model, one or more design elements in the design document, wherein the trained machine learning model is trained using the sample design elements that are automatically extracted from the enhanced sample design document;
       determining a location associated with each of the detected one or more design elements;
       determining a type associated with each of the detected one or more design elements; and
       augmenting the design document with the determined location and type of each of the detected one or more design elements.

13. The non-transitory computer readable medium of claim 12, wherein the method further comprises:
    receiving a user input;
    determining one or more design elements in the enhanced design document based on the received user input; and
    displaying information associated with the determined one or more design elements based on the enhanced design document.

14. The non-transitory computer readable medium of claim 12, wherein the trained machine learning model is convolutional neural network model.

15. The non-transitory computer readable medium of claim 7, wherein prior to determining the design element data set, in the design file, that corresponds to each of the one or more sample design elements in the sample design image, the method comprises:
    converting the design model to a coded design image, the coded design image comprising one or more coded design elements corresponding to the one or more model design elements;
    determining a unique identifier for each of the one or more model design elements based on the coded design image;
    storing each determined unique identifier in association with the respective model design element in the design file;
    determining an alignment between the sample design image and the coded design image; and
    mapping the one or more sample design elements in the sample design image with the one or more coded design elements in the coded design image.

16. The computer-implemented method of claim 6, wherein the design file includes a 3D design file and the design model includes a 3D design model, such that the one or more model design elements each include a 3D design element.

17. The computer-implemented method of claim 16, wherein the sample design image includes a 2D sample design image and the coded design image includes a coded 2D design image, such that the one or more sample design elements each include a 2D sample design element and the one or more coded design elements each include a coded 2D design element.

18. The system of claim 9, wherein prior to determining the design element data set, in the design file, that corresponds to each of the one or more sample design elements in the sample design image, the method comprises:

converting the design model to a coded design image, the coded design image comprising one or more coded design elements corresponding to the one or more model design elements;

determining a unique identifier for each of the one or more model design elements based on the coded design image;

storing each determined unique identifier in association with the respective model design element in the design file;

determining an alignment between the sample design image and the coded design image; and mapping the one or more sample design elements in the sample design image with the one or more coded design elements in the coded design image.

19. The system of claim 18, wherein the design file includes a 3D design file and the design model includes a 3D design model, such that the one or more model design elements each include a 3D design element; and wherein the sample design image includes a 2D sample design image and the coded design image includes a coded 2D design image, such that the one or more sample design elements each include a 2D sample design element and the one or more coded design elements each include a coded 2D design element.

20. The non-transitory computer readable medium of claim 15, wherein the design file includes a 3D design file and the design model includes a 3D design model, such that the one or more model design elements each include a 3D design element; and wherein the sample design image includes a 2D sample design image and the coded design image includes a coded 2D design image, such that the one or more sample design elements each include a 2D sample design element and the one or more coded design elements each include a coded 2D design element.

* * * * *

UNITED STATES PATENT AND TRADEMARK OFFICE
CERTIFICATE OF CORRECTION

PATENT NO. : 11,586,918 B2
APPLICATION NO. : 16/893462
DATED : February 21, 2023
INVENTOR(S) : Bruno Alves et al.

It is certified that error appears in the above-identified patent and that said Letters Patent is hereby corrected as shown below:

In the Claims

In Column 26, Line 29, in Claim 14, after "learning model is" and before "convolutional," the term --a-- should be inserted.

In Column 26, Line 31, in Claim 15, the term "claim 7" should be deleted and replaced with "claim 12.".

Signed and Sealed this
Eighteenth Day of April, 2023

Katherine Kelly Vidal
*Director of the United States Patent and Trademark Office*